United States Patent

Wong

(10) Patent No.: US 6,703,324 B2
(45) Date of Patent: Mar. 9, 2004

(54) MECHANICALLY REINFORCED HIGHLY POROUS LOW DIELECTRIC CONSTANT FILMS

(75) Inventor: Lawrence D. Wong, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 80 days.

(21) Appl. No.: 09/745,397

(22) Filed: Dec. 21, 2000

(65) Prior Publication Data

US 2002/0115285 A1 Aug. 22, 2002

(51) Int. Cl.$^7$ .............................................. H01L 21/31
(52) U.S. Cl. .................. 438/787; 438/623; 438/624; 438/761; 438/781; 438/790
(58) Field of Search ............................... 438/758, 409, 438/960, 781, 264, 622, 623, 624, 787, 790, 761

(56) References Cited

U.S. PATENT DOCUMENTS

| | | | |
|---|---|---|---|
| 5,449,427 A | * | 9/1995 | Wojnarowski et al. ...... 156/155 |
| 5,804,508 A | * | 9/1998 | Gnade et al. ............... 438/778 |
| 5,895,263 A | | 4/1999 | Carter et al. |
| 6,063,714 A | | 5/2000 | Smith et al. |
| 6,280,794 B1 | * | 8/2001 | TU et al. ..................... 427/379 |
| 6,329,017 B1 | * | 12/2001 | LIU et al. .................... 427/240 |
| 6,479,374 B1 | * | 11/2002 | Ioka et al. .................. 438/601 |

FOREIGN PATENT DOCUMENTS

| | | |
|---|---|---|
| EP | 0333132 A | 9/1989 |
| EP | 0881678 A | 12/1998 |
| WO | WO 9952136 A | 10/1999 |
| WO | WO 9963587 A | 12/1999 |

OTHER PUBLICATIONS

International Search Report PCT/US 01/43646.

* cited by examiner

*Primary Examiner*—Amir Zarabian
*Assistant Examiner*—Christy Novacek
(74) *Attorney, Agent, or Firm*—Cyndi M. Wheeler (57) ABSTRACT

A porous medium, such as a low dielectric constant film, can be made into an aggregate material to provide increased mechanical strength on a temporary basis. This can be achieved by, for example, a permeable modification treatment of the porous medium. By introduction of a secondary component into the void fraction of the porous medium, the mechanical properties are temporarily improved such that a porous film has mechanical characteristics similar to those of a much stiffer film. Methods in accordance with the present invention permit effective processing of highly porous interlayer dielectric (ILD) materials in a Cu damascene interconnect technology. Once a process operation such as a Cu chemical mechanical polishing (CMP) process, which requires greater mechanical strength than that provided by the porous film alone, is completed, the secondary component can be removed by methods such as displacement or dissolution.

18 Claims, 5 Drawing Sheets

MECHANICALLY REINFORCED HIGHLY POROUS LOW DIELECTRIC CONSTANT FILMS

BACKGROUND OF THE INVENTION

1. Field of the Invention

The present invention relates generally to microelectronic structures and fabrication methods, and more particularly to the formation of electrically insulating structures and materials which have low dielectric constants.

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as silicon dioxide.

A consequence of having of patterned conductive material separated by an insulating material, whether the conductive material is on a single level or multiple levels, is the formation of undesired capacitors. The parasitic capacitance between patterned conductive material, or more simply, interconnects, separated by insulating material on microelectronic devices contributes to effects such as RC delay, power dissipation, and capacitively coupled signals, also known as cross-talk.

One way to reduce the unwanted capacitance between the interconnects is to increase the distance between them. Increased spacing between interconnect has adverse consequences such as increased area requirements, and corresponding increases in manufacturing costs. Another way to reduce the unwanted capacitance between the interconnects is to use an insulating material with a lower dielectric constant.

What is needed is a structure providing low parasitic capacitance between patterned conductors, and methods of making such a structure.

BRIEF DESCRIPTION OF THE DRAWINGS

FIGS. 1–3 represent prior art and FIGS. 4–10 are illustrative of exemplary embodiments of the present invention. FIGS. 1–10 show schematic cross-sections of dielectric layers, however, for the sake of clarity, and as will be recognized by those skilled in the art of semiconductor manufacturing, other layers, such as those in which transistors and diodes are formed, are not included in these illustrative figures.

DETAILED DESCRIPTION

Temporarily mechanically reinforced interlayer dielectric structures and methods of manufacturing such structures are described. Such temporarily mechanically reinforced interlayer dielectric structures are useful for, at least, manufacturing integrated circuits having highly porous low-k interlayer dielectrics. In the following description, numerous specific details are set forth to provide an understanding of the present invention. It will be apparent however, to those skilled in the art and having the benefit of this disclosure, that the present invention may be practiced with apparatus, compositions, and processes that vary from those specified herein.

Reference herein to "one embodiment", "an embodiment", or similar formulations, means that a particular feature, structure, or characteristic described in connection with the embodiment is included in at least one embodiment of the present invention. Thus, the appearances of such phrases or formulations herein are not necessarily all referring to the same embodiment. Furthermore, various particular features, structures, or characteristics may be combined in any suitable manner in one or more embodiments.

Terminology

The terms, chip, integrated circuit, monolithic device, semiconductor device, and microelectronic device, are often used interchangeably in this field. The present invention is applicable to all the above as they are generally understood in the field.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The expression, low dielectric constant material, refers to materials having a lower dielectric constant than silicon dioxide. For example, organic polymers, amorphous fluorinated carbons, nanofoams, silicon based insulators containing organic polymers, carbon doped oxides of silicon and fluorine doped oxides of silicon have lower dielectric constants than silicon dioxide.

The letter k, is often used to refer to dielectric constant. Similarly, the terms high-k, and low-k, are used in this field to refer to high dielectric constant and low dielectric constant respectively, where high means greater than the dielectric constant of silicon dioxide, and low means lower than the dielectric constant of silicon dioxide.

The term intralayer dielectric as used in this field is understood to refer to the dielectric material disposed between interconnect lines on a given interconnect level. That is, an intralayer dielectric is found between adjacent interconnect lines, rather than vertically above or below those interconnect lines.

The term vertical, as used herein, means substantially perpendicular to the surface of a substrate.

The parasitic capacitance seen by an interconnect line is a function of the distance to another conductor and the dielectric constant of the material therebetween. However, increasing the spacing between interconnect lines increases the physical size, and thus the cost, of an integrated circuit. Therefore, in order to manufacture integrated circuits with low parasitic capacitance between interconnect lines, it is desirable to electrically isolate the conductors from each other with an insulator having a low dielectric constant.

One way to reduce the adverse effects of parasitic capacitance (e.g., RC interconnect delay) is to, as mentioned above, use low-k materials as insulators in advanced microelectronics products (e.g., integrated circuits). To achieve low dielectric constants, one can either use a material which possesses a low dielectric constant and/or to introduce porosity into the film. By increasing the film void fraction, which may be referred to as porosity, the thermal-mechanical properties of the material can be degraded. Process integration of a highly porous interlayer dielectric (ILD) film in a Cu damascene interconnect structure can be a demanding challenge. Control of structure is an important aspect of the integrated circuit (IC) fabrication process with nanoporous materials. Illustrative embodiments of the present invention include a process in which highly porous materials can be integrated into a Cu damascene interconnect structure.

Creation of mesoporous (nanoporous) low-k materials can be achieved by several known methods. For example, such porous films can be engineered as aerogels/xerogels (by sol-gel, templating processes, CVD, etc.) with either open or closed pore structures. In such films the pore radius and void fraction can be modulated by choice of precursor and conditioning technique. Because the mechanical strength of a film tends to decrease as porosity is increased, processes such as e-beam, or UV flood exposure, have been developed to increase the mechanical strength (such as hardness/modulus or fracture toughness) of the film. However, these processes can degrade the film dielectric constant (i.e., increase the dielectric constant) by increasing the film density or extent of crosslinking of the low-k material. Additionally, films that are highly porous may not even be susceptible of sufficient film strengthening by these processes.

In accordance with the present invention, a porous film can be made into an aggregate material to provide increased mechanical strength on a temporary basis. This can be achieved by, for example, a permeable modification treatment of the porous medium. By substitution of a secondary component into the void fraction, the mechanical properties are temporarily improved such that the porous film has mechanical characteristics similar to those of a much stiffer film. Once a process operation such as the Cu CMP process, which requires greater mechanical strength than that provided by the porous film alone, is completed, the secondary component (also referred to as the substitutional phase, or second phase) can be removed by methods such as displacement or dissolution.

Removal of the secondary component ensures the goal of maintaining the desirable low dielectric constant of the ILD film. Depending on the type of material selected, removal can be achieved in several ways. Second phase removal can be done by techniques such as utilizing a miscible component (dissolution followed by evaporation), or displacement such as with techniques employed in tertiary oil recovery. Pyrolysis or thermal decomposition of a labile secondary component should be avoided unless the temperature is sufficiently low so as not to affect the exposed copper lines.

Figure 1:
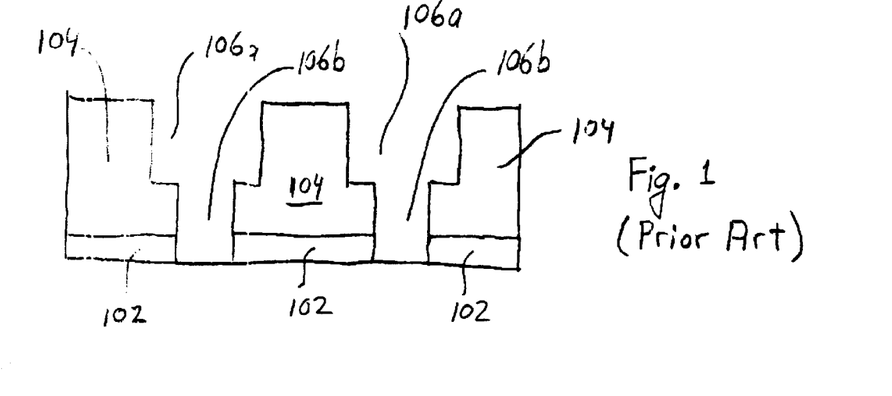
FIG. 1 is a schematic cross-section of a partially processed substrate showing a dual damascene opening formed in a composite interlayer dielectric having first and second layers in accordance with a prior art method.
Figure 2:
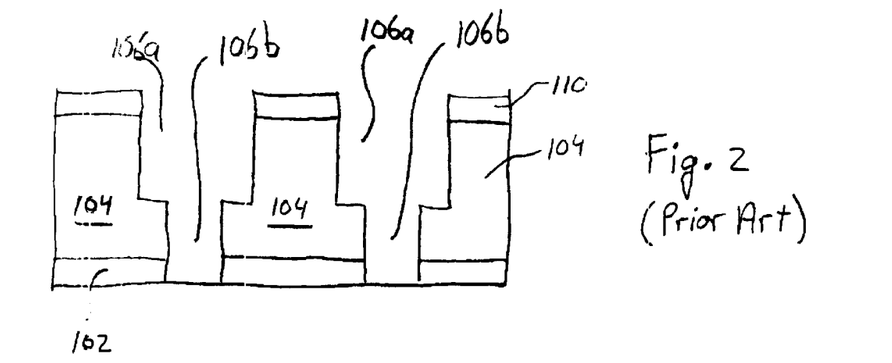
FIG. 2 is a schematic cross-section of a partially processed substrate showing a dual damascene opening formed in a composite interlayer dielectric having first, second, and third layers in accordance with a prior art method.
Figure 3:
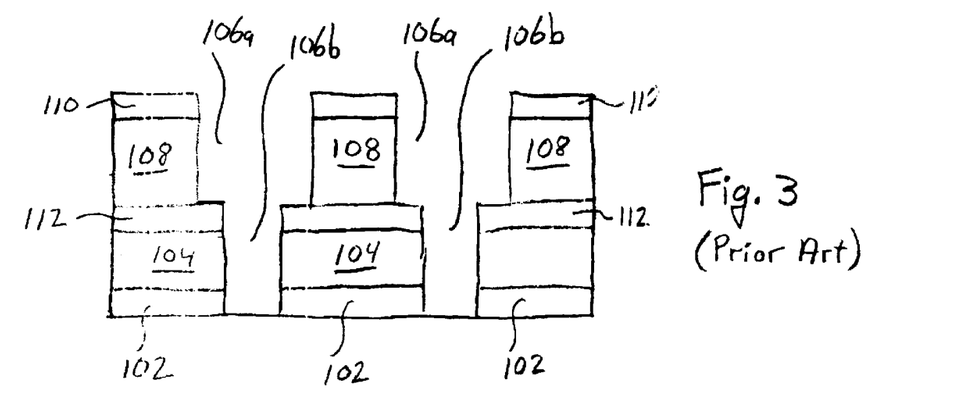
FIG. 3 is a schematic cross-section of a partially processed substrate showing a dual damascene opening formed in a composite interlayer dielectric having first, second, third, fourth, and fifth layers in accordance with a prior art method.

FIGS. 1–3 illustrate various prior art approaches to combining low-k dielectric materials with the dual damascene openings typically used to form copper interconnect lines in integrated circuits. More particularly, FIG. 1 shows an etch stop layer 102 which is typically formed from a material such as SiN. Etch stop layer 102 overlies a lower interconnect layer. A thicker dielectric layer 104 overlies etch stop layer 102 and has a lower dielectric constant than etch stop layer 102. In the example of FIG. 1, dielectric layer 104 is a carbon doped oxide. A dual damascene structure 106a, 106b, is formed in the layers 102, 104. The dual damascene structure includes a trench portion 106a and a via opening portion 106b. FIG. 2 illustrates an alternative prior art structure wherein dielectric 104 is a spin-on polymer or highly porous material rather than the carbon doped oxide of FIG. 1; and another dielectric layer 110 overlies dielectric layer 104. Dielectric layer 110 is used to provide additional mechanical strength to make up for the use of the spin-on polymer or highly porous material which are mechanically weaker than the carbon doped oxide. FIG. 3 shows another alternative embodiment, similar to that of FIG. 2, but which includes an intermediate etch stop layer 112. All of these prior art approaches suffer from one or more deficits in terms of providing a very low dielectric constant, and ease of manufacturability.

Figure 4:
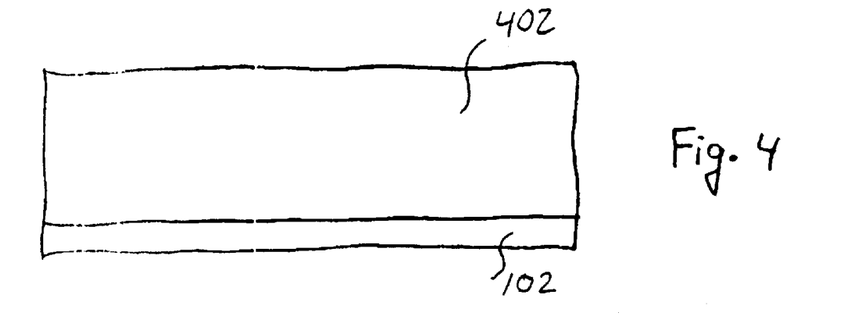
FIG. 4 is a schematic cross-section of a partially processed substrate having a first dielectric layer with a first dielectric constant, and a second dielectric layer which is thicker and has a lower dielectric constant. The second dielectric layer being characterized by its relatively high level of porosity.

An illustrative embodiment of the present invention is shown in FIGS. 4–10. More particularly, FIG. 4 shows a first dielectric 102 formed on a substrate (not shown). First dielectric 102 is typically a material such as SiOC, SiC, or SiN. These materials are selected because they have acceptable etch selectivity with respect to the subsequently formed overlying layers, and because they are effective barriers to the diffusion of copper atoms. Typically, the substrate is a wafer upon which other manufacturing operations have been performed so as to form various electrical components, including, but not limited to, transistors, as well as conductive interconnections. However, since these other structures and processing operations are (a) well known in this field, and (b) not relevant to the present invention, they will not be discussed further. A second dielectric layer 402 is then formed over first dielectric 102. Second dielectric layer 402 is characterized by having a particularly low dielectric constant, in the range of, for example, 1.8 to 2.6. Those skilled in the art will recognize that this range is approximate and that some variances may occur due to the tolerances involved in manufacturing processes used to form these dielectric layers. Second dielectric layer 402 may be formed by depositing a mesoporous $SiO_2$, or a polymer.

Oxide based porous films may be formed by means of sol-gel chemistry. For example, a process of forming an oxide based porous film is started with $RSi(OR')_3$ dissolved in a polar solvent such as, for example, alcohol, where R may be H, $CH_3$, or other alkyl groups; R' may be $CH_3$, $CH_2CH_3$, or other alkyl groups. Water is added, along with a catalyst (e.g., an acid or a base) to start the condensation reaction which forms Si—O—Si bonds, and alcohol as a byproduct. The R group stays attached to the Si during this process, leaving behind a carbon source. If R is a long chain alkyl, some of the carbon bonds will be broken during thermal treatment to form $CO_2$ and $H_2O$. The outgassing of the carbon dioxide and water results in the formation of pores. Pore formation may be affected by such things as solvent or solent mixture vapor pressure, R group composition and structure, sacrificial additives (e.g., organic molecules can be burned out during thermal processing along with the R groups), reactive additives to affect condensation kinetics, and pH. Aging in ammonia can also affect film properties by affecting condensation kinetics.

Silsesquioxane chemistry is an extension of sol-gel chemistry. In this approach to forming oxide based porous films, the starting materials are $(RSiO_{1.5})_n$, which are cage structures that look like oligimers of $RSi(OR')_3$. Thermal curing causes further condensation of the structures, and film properties are varied accordingly.

With respect to polymer-based porous films, polymers of benzene rings connected by conjugated spacers (i.e., carbon—carbon double or triple bonds) are used. Thermal treatment causes further polymerization at the ends of the polymers as well as in the middle (i.e., cross-linking) to give denser films with better mechanical properties. Adding porosity to such films is typically accomplished by way of solvent evaporation (i.e., vapor pressure of solvent mixtures) and use of surfactants.

Figure 5:
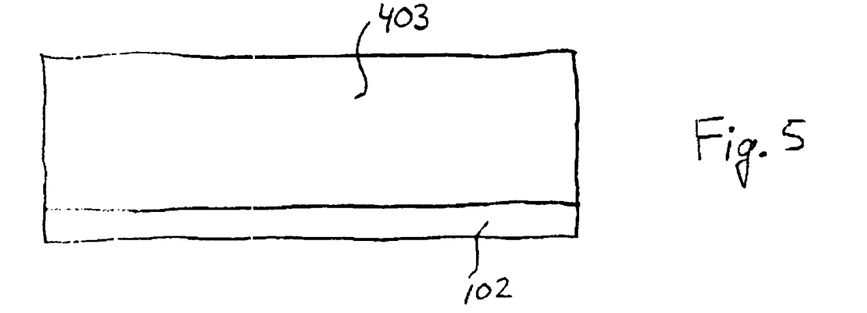
FIG. 5 is a schematic cross-section the structure of FIG. 4, after the second dielectric layer has been processed to increase porosity and thereby decrease its dielectric constant.

FIG. 5 shows the structure of FIG. 4, after second dielectric layer 402 has been converted to dielectric layer 403 by a curing, or aging process. Dielectric layer 403 has a dielectric constant in the range of 1.5 to 2.2. Those skilled in the art will recognize that this range is approximate and that some variances may occur due to the tolerances involved in any such manufacturing process.

With respect to curing or aging, the process for treating spin-on polymers, sol-gel, and nanoporous glasses are different. Some examples of generic recipes for increasing the porosity of polymers, sol-gel, and nanoporous glasses that have been formed on a wafer are provided in the table below.

TABLE 1

| Polymer: | Chill plate | 20° C.–25° C., 60 sec. |
| --- | --- | --- |
| | Spin coat | 2–4 k RPM, 23 C., 40% RH |
| | Hot plate bake | 200° C.–325° C., $N_2$ ambient (controlled $O_2$ < 100 ppm), 90 sec. |
| | Spin bake | 325° C., 90 sec. |
| | Spin bake | 460° C., 300° C., $N_2$ ambient |
| | Chill plate | 20° C.–25° C., 60 sec. |
| Sol-Gel: | Spin coat | 2–3 k RPM, 45 sec., 23 C., 40% RH |
| | Pre-bake | 80° C., air ambient, 90 sec |
| | Pre-wait | $N_2$ ambient, 60 sec |
| | Soft bake | 200° C., $N_2$ ambient, 180 sec |
| | Post-wait | $N_2$ ambient, 60 sec |
| | Pre-cure | 400° C., 300 sec., $N_2$ ambient |
| | Chill plate | 20° C.–25° C., 60 sec. |
| Nanoporous glass: | Spin coat | 2–4 k RPM, 45 sec., 23° C., 40% RH |

TABLE 1-continued

| | Gelation | $NH_3$ treatment |
| --- | --- | --- |
| | Bake | 150° C., $N_2$ ambient, 60 sec |
| | Chill plate | 20° C.–25° C., 60 sec. |

A final cure may be employed such as a furnace cure (400° C., $N_2$ ambient, 30 min. at temperature) or a hot plate final cure step (420° C.–460° C., 3–5 minutes).

Figure 6:
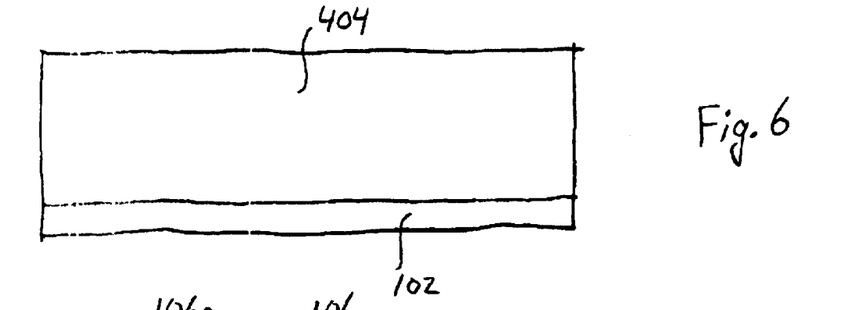
FIG. 6 is a schematic cross-section of the structure of FIG. 5, after the second dielectric layer has been processed so as to introduce a filler material into the pores of the second dielectric layer.

FIG. 6 shows the structure of FIG. 5, after dielectric 403 is modified to become dielectric layer 404. Dielectric layer 404 is formed by filling the pores of dielectric 403 with one or more materials that provide mechanical strength to aggregate dielectric layer 404. This mechanical strengthening (also referred to as mechanical reinforcement) is preferably a process which is substantially reversible. Although, the additional mechanical strength is beneficial in terms of dielectric layer 404 being able to withstand subsequent processing operations, the filler material tends to increase the dielectric constant of dielectric layer 404, which in turn adversely affects its desired electrical properties. It should be understood, that with respect to this "filling" operation, not every pore is necessarily filled, nor are pores that are filled necessarily completely filled. That is, some pores may be completely filled, some pores may be partially filled, and some pores may not be filled at all. What is important is that there be sufficient "filling" to provide the mechanical strength needed to withstand subsequent processing operations. Fillers may be introduced into the pores by methods, including but not limited to, immersion in a liquid, and spin-on of the filler. In this illustrative example, subsequent processing operations include chemical mechanical polishing, etching, and plating. The present invention is not limited in any respect by the nature of the operations which are performed subsequent to the mechanical reinforcement.

Figure 7:
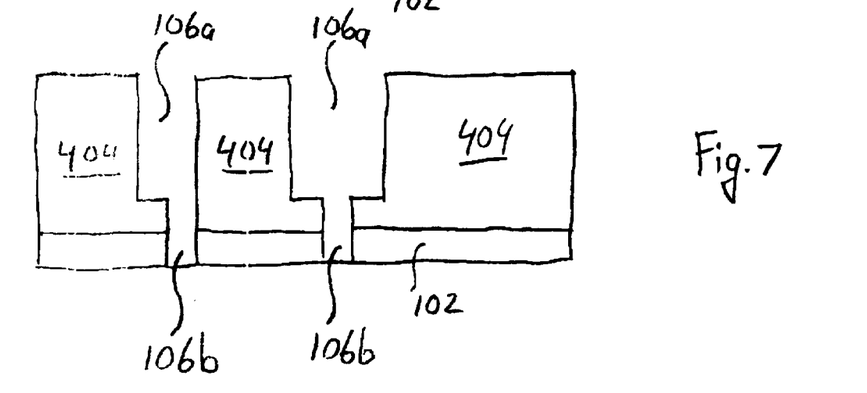
FIG. 7 is a schematic cross-section of the structure of FIG. 6, after the first and second dielectric layers have been etched to form dual damascene openings.

FIG. 7 shows the structure of FIG. 6, after photolithography and etching operations, which are well-known in the field of semiconductor manufacturing, are performed in order to create trench 106a and via 106b openings. As can be seen in FIG. 7, trench 106a is formed in dielectric layer 404, while via opening 106b is formed through both dielectric layer 404 and etch stop layer 102.

Figure 8:
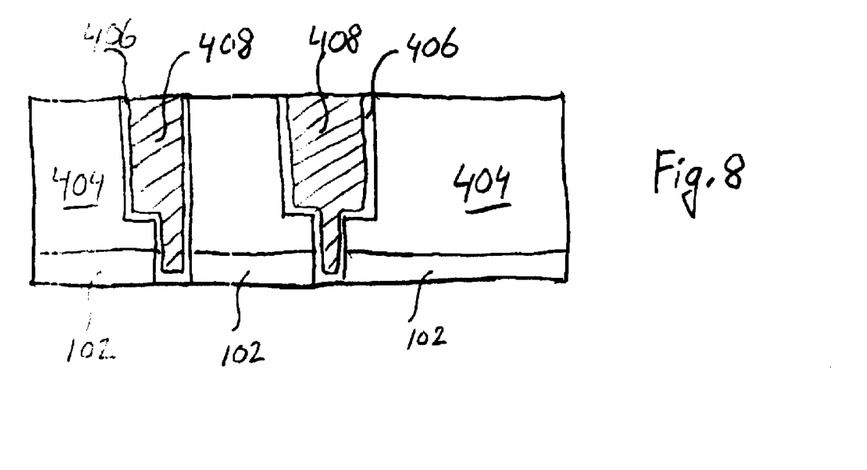
FIG. 8 is a schematic cross-section of the structure of FIG. 7, after a Cu barrier layer and seed layer have been formed, a Cu layer has been deposited, and excess Cu removed by chemical mechanical polishing.

FIG. 8 shows the structure of FIG. 7, after the processing operations of forming a copper diffusion barrier 406 and copper interconnect lines 408. The diffusion barrier is formed over the entire surface of the substrate including the top surface of dielectric layer 404 and the surfaces of trenches 106a and via openings 106b As is known in the field of semiconductor manufacturing, copper diffusion barriers may be comprised of various materials, although tantalum and tantalum nitride are currently preferred materials. Also as is known, a seed layer is typically formed over barrier layer 406 and then copper is plated over the barrier layer and is built up until the vias and trenches are filled. This, of course, leaves excess copper and barrier layer material on the top surface of dielectric layer 404 which is then removed, typically by chemical mechanical polishing. The structure of FIG. 8 is obtained by forming the barrier layer, the seed layer, the copper, and removing excess copper and barrier material from the top surface of the substrate by chemical mechanical polishing. Mechanically reinforced dielectric layers in accordance with the present invention, such as dielectric layer 404, are compatible with the damascene style of metal interconnect line formation.

Figure 9:
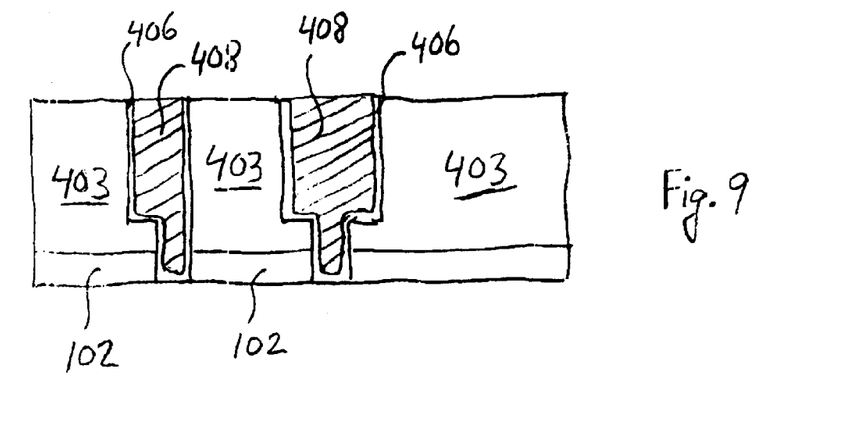
FIG. 9 is a schematic cross-section of the structure of FIG. 8, after the filler material has been driven out of the pores of the second dielectric layer.

FIG. 9 shows the structure of FIG. 8, after further processing operations return dielectric layer 404 to its previous form as dielectric layer 403. These operations are intended to remove most, if not all, of the filler material(s) from the pores of dielectric layer 403. The filler, depending upon its composition and that of dielectric layer 403, may be removed by dissolving and evaporating, or by displacement, or by pyrolysis.

As mentioned above, the filler can be removed by several techniques. In one removal technique referred to as dissolution, a high contrast in solubility between the porous film and the filler is needed. In one embodiment, the porous film is primarily composed of an inorganic material while the filler is organic. The filler becomes the targeted solute which is selectively removed by choice of solvent or aqueous solution. The porous film should be relatively inert, and the filler may be a non-polar organic material like a negative resist (e.g., cyclized polyisprene polymer), a positive resist (e.g., a Novolac resin), or RELACS (a commercial resin from Mitsubishi Electric Corp. of Tokyo, Japan). For a negative resist resin (without need of photosensitizer), organic strippers can be used to breakdown the filler. These strippers can be phenol-based, low-phenol, or phenol-free organic strippers. For a positive resist (e.g., an inexpensive resin without the photoactive material) or RELACS as a filler, solutions such as tetra-methyl ammonium hydroxide or ethlylacetate can be used. Other organic filler materials can be removed by solvents such as, but not limited to, benzene, xylene, toluene, and IPA. In the anhydrous technique of filler removal, a treatment of organic resist resins with $SO_3$ chemically modifies the material and renders the filler water soluble. In another technique, oxidizing strippers may be used. That is, wet inorganic solutions such as, for example, a heated solution of $H_2SO_4$ and an oxidant such as $H_2O_2$, ozone, or ammonium persulfate can be used to remove the filler. In another method, referred to as the reduction technique, the filler can be removed, with or without the use of a low energy RF plasma glow discharge or microwave plasma discharge. Use of $H_2$, $H_2/N_2$, $NH_3$ gases (with possible addition of dilute quantities of $O_2$ or fluorocarbons) can facilitate removal of the filler without attacking the porous ILD material. Low temperature reduction can be achieved from room temperature to less than typical backend process temperatures with the assistance of an RF plasma regardless of whether it is direct, indirect, or afterglow. For elevated temperatures compatible with standard backend processing, straight reduction may be employed. In the plasma technique of filler removal, an $H_2$, $H_2/N_2$, or $NH_3$ RF plasma discharge or microwave plasma discharge can be used to selectively remove the filler without attacking the porous ILD material. In the capillary displacement method of filler removal, a supercritical fluid or formulated fluid with surfactant may be applied to displace the filler material from the pores within the ILD material. In this case, the filler is judiciously chosen with a lower viscosity such that it can be displaced under reasonable pressures.

Figure 10:
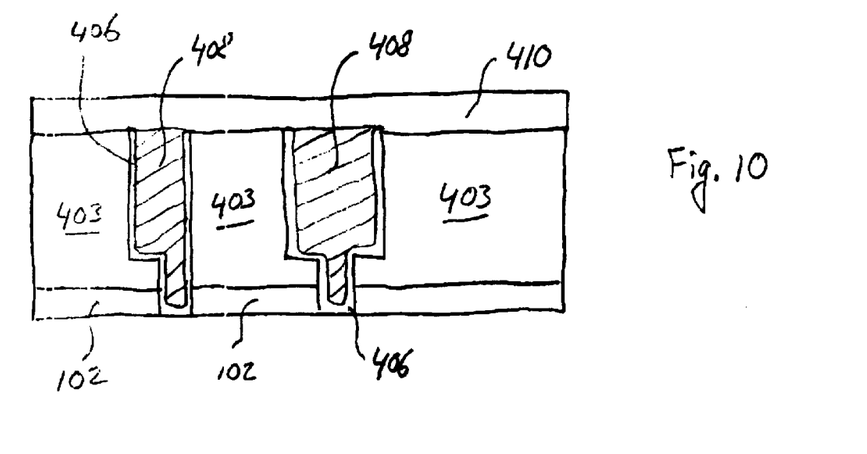
FIG. 10 is a schematic cross-section of the structure of FIG. 9, after a Cu diffusion barrier has been deposited over the second dielectric layer and the exposed portions of the Cu interconnect lines.

FIG. 10 shows the structure of FIG. 9, after an etch stop layer 410 has been formed over dielectric 403, barrier layer 406 and copper 408. Where copper is used to form the underlying interconnect lines, etch stop layer 410 is formed from a material such as SiN or SiC which can act as a barrier to the diffusion of copper atoms.

Figure 11:
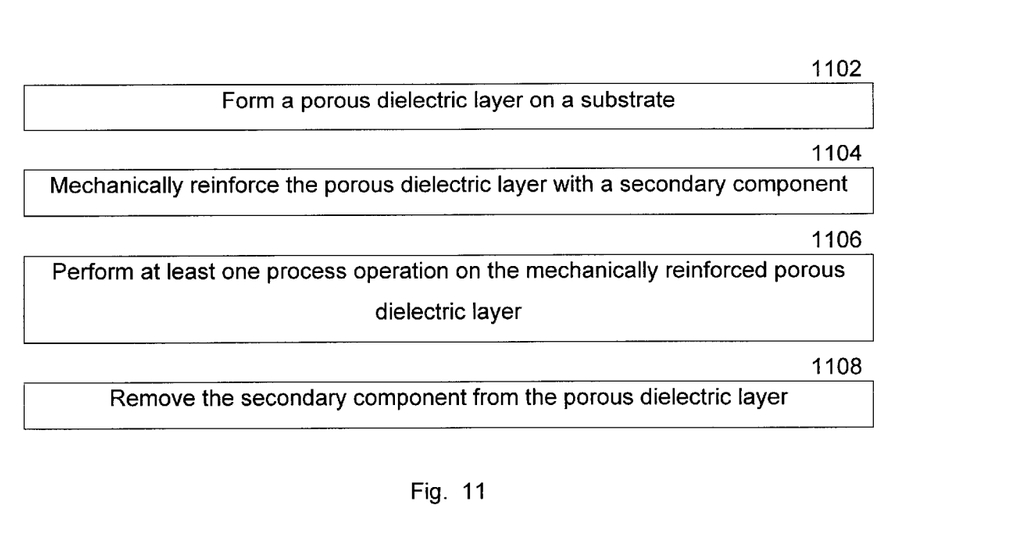
FIG. 11 is a flow diagram illustrating a process in accordance with the present invention.
Figure 12:
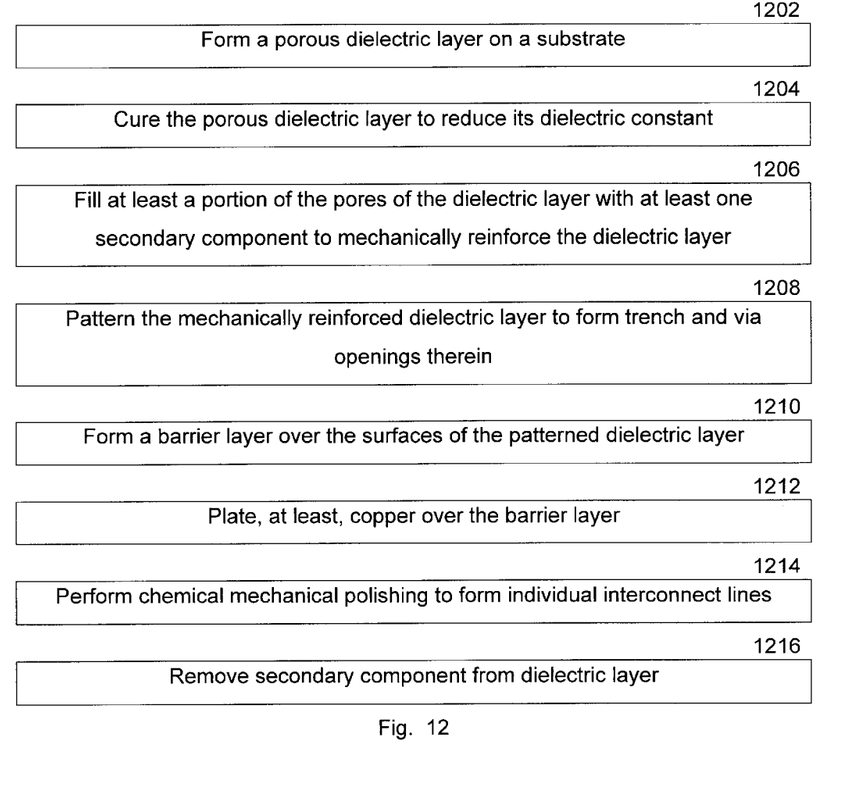
FIG. 12 is a flow diagram illustrating an alternative process in accordance with the present invention.

FIGS. 11–12 are flow diagrams showing processes in accordance with the present invention. FIG. 11 illustrates a general method of forming interlayer dielectrics that are temporarily mechanically reinforced. FIG. 12 illustrates an exemplary method embodying the present invention in which a mesoporous oxide of silicon is temporarily reinforced with a secondary component in its void fraction, various mechanically rigorous operations are performed, and the secondary component is removed by dissolution and evaporation. Several removal methods have been described above. For those involving wet processing, the process flow would require a rinse followed by a bake/cure step. For the dry or reduction technique, no additional steps should be required.

Referring now to FIG. 11, a method is described in which a porous dielectric layer is formed on a substrate (1102). Such a porous dielectric may be a mesoporous oxide of silicon or a polymer. In one embodiment the substrate over which the porous dielectric layer is formed is an insulating layer such as silicon nitride or silicon carbide. These materials are suitable for integration into an integrated circuit manufacturing process because not only are they electrical insulators but they may also serve as barriers to the diffusion of copper atoms. This underlying dielectric layer itself is formed over other layers of a wafer in which various active, passive, and electrical interconnect components are formed. The porous dielectric layer is mechanically reinforced by forcing a secondary component into at least a portion of the dielectric layer's void fraction (1104). By filling at least a portion of some or all of these pores, the mechanical strength of the porous dielectric layer is increased. Once the dielectric layer has been strengthened in this way, one or more process operations that would have been too stressful to be successfully completed on the unreinforced dielectric layer may be performed (1106). Such process operations include, but are not limited to, chemical mechanical polishing, etching, and deposition of various materials. After the one or more process operations have been performed, the secondary component is removed (1108). Those skilled in the art of semiconductor manufacturing will appreciate that some residual portion of the secondary component may be left behind after the removal operation. Generally, it is desirable to keep these residual amounts of secondary component to the smallest practical amounts because the dielectric constant is reduced, which is electrically desirable, as the secondary component is driven out of the dielectric layer.

Referring now to FIG. 12, a method is described in which a porous dielectric layer is formed on a substrate (1202). The porous dielectric layer typically has a dielectric constant in the range of 1.8 to 2.6. The dielectric layer is then cured (1204) to increase its porosity and thereby reduce its dielectric constant to the range of 1.5 to 2.2. Unfortunately, this increased porosity leaves the dielectric layer too mechanically weak to withstand subsequent process operations such as, for example, chemical mechanical polishing. The dielectric layer is then modified to increase its mechanical strength by filling at least a portion of the pores of the dielectric layer with at least one secondary component (1206). The dielectric constant of the dielectric layer is increased by the pore filling operation. In this illustrative embodiment of the present invention, the reinforced dielectric layer is then patterned to form trench and via openings (1208). As can be seen with reference to FIGS. 7–10, vias are formed not only in the mechanically reinforced dielectric layer, but also through the underlying etch stop layer. Such patterning is well-known in the field of semiconductor manufacturing and generally involves defining patterns in a photoresist and then etching the exposed portions of the underlying material. After formation of the trench and via openings a barrier layer is formed over the surfaces of the patterned dielectric layer (1210). In this example, the barrier layer is selected so as to substantially prevent the diffusion of copper atoms. A plating process is performed so as to form a metal layer over the barrier layer (1212), and the metal layer is typically copper, although some alloy of copper may be used. In fact, the present invention is not limited in any way by the choice of metals. Excess metal is removed by chemical mechanical polishing in this damascene process to form individual interconnect lines in the trench and via openings (1214). The secondary component is then removed (1216). After removal of the secondary component, the dielectric constant of the dielectric layer is returned to a lower value. As described above the secondary component may be removed by dissolution and evaporation, displacement, or pyrolysis.

Conclusion

In general, embodiments of the present invention provide low dielectric constant insulators on integrated circuits. Methods, in accordance with one aspect of the present invention, permit integration of highly porous ILD materials into a Cu damascene interconnect manufacturing flow by temporarily modifying the mechanical characteristics of the porous ILD material.

An advantage of some embodiments of the present invention is that low dielectric constants insulators having the necessary mechanical strength to withstand subsequent processing, such as for example, chemical mechanical polishing are obtained.

The present invention may be implemented with various changes and substitutions to the illustrated embodiments. For example, the present invention may be implemented on substrates comprised of materials other than silicon, such as, for example, gallium arsenide, silicon on insulator (SOI), or sapphire. Additionally, illustrative embodiments describe mesoporous silicon dioxide and polymers, however the present invention may be practiced with other low-k dielectric materials.

It will be readily understood by those skilled in the art that various other changes in the details, materials, and arrangements of the parts and operations which have been described and illustrated in order to explain the nature of this invention may be made without departing from the principles and scope of the invention as expressed in the subjoined claims.

What is claimed is:

1. A process, comprising:

forming a porous dielectric material on a substrate, the porous dielectric material having a plurality of unfilled pores;

after forming said porous dielectric material on said substrate, filling at least a portion of said unfilled pores with at least one material, forming a plurality of filled pores;

after filling said unfilled pores with at least one material, forming at least one damascene opening in said dielectric material having said filled pores;

forming a metal layer over the dielectric material and in the at least one damascene opening;

polishing the metal layer so as to remove that portion of the metal layer which is outside of the damascene opening; and removing at least a portion of the at least one material from said filled pores.

2. A process, comprising:

forming a porous dielectric material on a substrate, the porous dielectric material having a plurality of unfilled pores;

after forming said porous dielectric material on said substrate, filling at least a portion of said unfilled pores with at least one material, wherein the at least one material comprises a material miscible in a solvent, forming a plurality of filled pores;

after filling said unfilled pores with at least one material, performing an operation on said dielectric material having said filled pores; and removing at least a portion of the at least one material from said filled pores.

3. A process, comprising:

forming a porous dielectric material on a substrate, the porous dielectric material having a plurality of unfilled pores;

after forming said porous dielectric material on said substrate, filling at least a portion of said unfilled pores with at least one material, forming a plurality of filled pores;

after filling said unfilled pores with at least one material, performing an operation on said dielectric material having said filled pores; and removing at least a portion of the at least one material from said filled pores, wherein removing comprises dissolving and evaporating.

4. A process, comprising:

forming a porous dielectric material on a substrate, the porous dielectric material having a plurality of unfilled pores;

after forming said porous dielectric material on said substrate, filling at least a portion of said unfilled pores with at least one material, forming a plurality of filled pores;

after filling said unfilled pores with at least one material, performing an operation on said dielectric material having said filled pores; and removing at least a portion of the at least one material from said filled pores, wherein removing comprises displacement.

5. A process, comprising:

forming a porous dielectric material on a substrate, the porous dielectric material having a plurality of unfilled pores;

after forming said porous dielectric material on said substrate, filling at least a portion of said unfilled pores with at least one material, forming a plurality of filled pores;

after filling said unfilled pores with at least one material, performing an operation on said dielectric material having said filled pores; and removing at least a portion of the at least one material from said filled pores, wherein removing comprises pyrolysis.

6. A process, comprising:

forming a porous dielectric material on a substrate, the porous dielectric material having a plurality of unfilled pores, wherein the porous dielectric material comprises mesoporous silicon dioxide;

after forming said porous dielectric material on said substrate, filling at least a portion of said unfilled pores with at least one material, forming a plurality of filled pores;

after filling said unfilled pores with at least one material, performing an operation on said dielectric material having said filled pores; and removing at least a portion of the at least one material from said filled pores.

7. A process, comprising:

forming a porous dielectric material on a substrate, the porous dielectric material having a plurality of unfilled pores;

after forming said porous dielectric material on said substrate, filling at least a portion of said unfilled pores with at least one material, wherein the at least one material comprises a resin, forming a plurality of filled pores;

after filling said unfilled pores with at least one material, performing an operation on said dielectric material having said filled pores; and removing at least a portion of the at least one material from said filled pores.

8. A method of forming a dual damascene copper interconnect structure, comprising:

depositing a low-k dielectric layer having pores;

curing the low-k dielectric layer;

filling at least a portion of said pores of the low-k dielectric layer with a first material;

patterning the low-k dielectric layer containing said filled pores so as to form at least one damascene opening;

forming a Cu diffusion barrier layer over the patterned dielectric layer;

forming a Cu seed layer over at least a portion of the Cu diffusion barrier layer;

forming a metal layer, the metal comprising Cu, over the seed layer and the diffusion barrier;

removing a portion of the metal layer by chemical mechanical polishing; and removing at least a portion of said first material from said filled pores.

9. The method of claim 8, wherein the low-k dielectric layer comprises an oxide of silicon.

10. The method of claim 8, wherein removing a portion of said first material from said filled pores comprises evaporation.

11. The method of claim 8, wherein removing a portion of said first material from said filled pores comprises displacement.

12. A method of temporarily increasing the mechanical strength of a porous film, comprising:

depositing a porous film on a substrate, the porous film having a plurality of pores, the size and density of the pores defining a porosity of the film;

treating the porous film to increase the porosity thereof;

introducing one or more filler materials into at least a first portion of the plurality of pores; and subsequently removing at least a portion of the one or more filler materials from at least a second portion of the plurality of pores.

13. The method of claim 12, wherein the porous film comprises mesoporous silicon dioxide.

14. The method of claim 12, wherein the porous film comprises a polymer.

15. The method of claim 12, wherein treating the porous film to increase the porosity thereof comprises curing.

16. The method of claim 12, wherein treating the porous film to increase the porosity thereof comprises aging.

17. A process, comprising:

forming a porous dielectric material on a substrate, the porous dielectric material having a plurality of unfilled pores;

after forming said porous dielectric material on said substrate, filling at least a portion of said unfilled pores with at least one material, wherein the at least one material comprises a material miscible in an aqueous solution, forming a plurality of filled pores;

after filling said unfilled pores with at least one material, performing an operation on said dielectric material having said filled pores; and removing at least a portion of the at least one material from said filled pores.

18. A process, comprising:

forming a porous dielectric material on a substrate, the porous dielectric material having a plurality of unfilled pores;

after forming said porous dielectric material on said substrate, filling at least a portion of said unfilled pores with at least one material, forming a plurality of filled pores;

after filling said unfilled pores with at least one material, forming at least one damascene opening in said dielectric material having said filled pores;

forming a metal layer over the dielectric material and in the at least one damascene opening, wherein the metal layer completely fills the at least one damascene opening; and removing at least a portion of the at least one material from said filled pores.

* * * * *